United States Patent
Shu et al.

(10) Patent No.: US 6,348,421 B1
(45) Date of Patent: Feb. 19, 2002

(54) DIELECTRIC GAP FILL PROCESS THAT EFFECTIVELY REDUCES CAPACITANCE BETWEEN NARROW METAL LINES USING HDP-CVD

(75) Inventors: Jen Shu, Saratoga; Michael E. Thomas, Milpitas, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/334,288

(22) Filed: Jun. 16, 1999

Related U.S. Application Data

(63) Continuation-in-part of application No. 09/019,900, filed on Feb. 6, 1998.
(60) Provisional application No. 60/136,426, filed on May 28, 1999.

(51) Int. Cl.[7] .................................................. H01L 21/31
(52) U.S. Cl. ........................ 438/788; 438/624; 438/631; 438/635; 438/645; 438/692; 438/693; 438/697
(58) Field of Search ...................... 438/692, 693, 438/697, 788, 618, 622, 627, 628, 633, 624, 631, 635, 424; 257/347, 638, 645, 651

(56) References Cited

U.S. PATENT DOCUMENTS

| | | | | |
|---|---|---|---|---|
| 5,821,168 A | * | 10/1998 | Jain | 438/692 |
| 5,858,869 A | * | 1/1999 | Chen et al. | 438/597 |
| 5,965,918 A | * | 10/1999 | Ono | 257/347 |
| 6,030,881 A | * | 2/2000 | Papasouliotis et al. | 438/424 |
| 6,184,158 B1 | * | 2/2001 | Shufflebotham et al. | 438/788 |

* cited by examiner

Primary Examiner—David Nelms
Assistant Examiner—Reneé R. Berry
(74) Attorney, Agent, or Firm—Stallman & Pollock LLP

(57) ABSTRACT

Substrate bombardment during HDP deposition of carbon-doped silicon oxide film results in filling the gaps between metal lines with carbon-doped low k dielectric material. This leads to the placement of low k dielectric between the narrow metal lines while the films over the metal lines have higher dielectric constant due to removal of carbon from these films during ion bombardment. Films over the metal lines have properties similar to silicon dioxide and are ready for sequential integration processes.

10 Claims, 2 Drawing Sheets

DIELECTRIC GAP FILL PROCESS THAT EFFECTIVELY REDUCES CAPACITANCE BETWEEN NARROW METAL LINES USING HDP-CVD

BENEFIT OF PROVISIONAL APPLICATION

This nonprovisional application claims the benefit of Provisional Application Ser. No. 60/136,426, filed May 28, 1999, by Jen Shu and Michael E. Thomas, titled "Dielectric Gap Fill Process That Effectively Reduces Capacitance Between Narrow Metal Lines Using HDP-CVD".

RELATED APPLICATION

The present application is a Continuation-In-Part of co-pending and commonly-assigned application Ser. No. 09/019,900, filed Feb. 6, 1998, titled "Producing a Thin Film Having a Low Dielectric Constant Using HDP-CVD."

BACKGROUND OF THE INVENTION

1. Field of the Invention

The present invention relates to fabrication of semiconductor integrated circuit device structures and, in particular, to a method of filling gaps between narrow metal lines with a carbon-doped, low k dielectric silicon oxide thin film utilizing High Density Plasma-Chemical Vapor Deposition (HDP-CVD), thereby effectively reducing the capacitance between the narrow metal lines.

2. Discussion of Related Art

In the fabrication of semiconductor integrated circuits, several levels of conductive interconnects are typically required to electrically connect the millions of active elements included in the circuit. Insulating materials, such as silicon dioxide ($SiO_2$), have been employed to isolate the interconnect wires in a given level of the IC as well as between its different levels. However, as interconnect wiring has become more dense, parasitics due to capacitive coupling negatively impact device performance, thus requiring insulators with lower dielectric constants. Pure $SiO_2$ thin films have a dielectric constant of around k=4. $SiO_2$ can be grown by oxidation of pure silicon using $O_2$ or $H_2O$ gas, or can be deposited by chemical vapor deposition (CVD) or High Density Plasma-Chemical Vapor Deposition (HDP-CVD) employing reactants such as $SiH_4/Ar/N_2O$, $SiH_4/Ar/NO$, and/or $SiH_4/Ar/O_2$ gas mixtures as reactants.

Current HDP-CVD $SiO_2$ processes use $SiH_4$ and $O_2$ for deposition along with Ar or He for sputtering. Referring to FIG. 1A, conventional CVD $SiO_2$ processes without a sputtering component result in the formation of voids between adjacent metal lines due to the high sticking probabilities of the precursors $SiH_3$ and $SiH_2$ in silane discharges coupled with insignificant surface diffusion. It is known that these voids can be eliminated in deposition of pure $SiO_2$ films by adding a sputtering component to the HDP-CVD process. Sputtering, which is controlled by applying high frequency bias power to the substrate, bombards the horizontal surfaces of the deposited $SiO_2$, as shown in FIG. 1B, and pulls back the corners of the gap between structures resulting in complete filling of the gaps between narrowly-spaced metal lines, as shown in FIG. 1C.

Work has been done wherein $SiO_2$ has been doped to lower the dielectric constant of the layer. For example, spin coating techniques have been employed to produce carbon-containing $SiO_2$ spin on glass (SOG) films with dielectric constants approaching k=3.0. While SOG films can be suitable for a great many applications, including providing interconnect dielectrics, they have a number of manufacturing disadvantages. For example, SOG processing involves the use of liquids and produces waste material that requires disposal. Also, SOG processing often produces films that have high $OH^-$ concentrations. In addition, SOG's often suffer from temperature instability, tensile stress and moisture absorption/desorption problems.

Organically-doped $SiO_2$ layers have also been deposited using CVD processes. One technique utilizes substitute precursors such as methylsilane ($CH_3$—$SiH_3$) or phenylsilane ($C_6H_5/SiH_3$) as a substitute for the $SiH_4$ precursor. However, with respect to this technique, the methyl group is only partially dissociated and some of the methyl constituents remain bonded to the silicon atom in the oxide layer. The resulting carbon-doped oxide layer has a dielectric constant around k=3. A further technique utilizes $CH_3$—$SiH_3$ and $H_2O_2$ as the reactant species.

While attempts have been made in the past to deposit carbon-doped $SiO_2$ layers utilizing Plasma Enhanced CVD techniques without sputtering, it has been found that the same voids are produced in these processes as those appearing in the deposition of pure $SiO_2$ layers without sputtering. Past attempts to deposit carbon-doped $SiO_2$ layers utilizing sputtering have appeared to result in the formation of pure $SiO_2$, the sputtering apparently resulting in the carbon species being driven from the $SiO_2$ structures. Thus, those skilled in the art have been lead away from forming carbon-doped $SiO_2$ layers using deposition processes enhanced by sputtering.

SUMMARY OF THE INVENTION

The use of carbon containing precursors to replace silane or added to silane and oxygen as the reactant species in an HDP-CVD reactor is desirable to produce a low dielectric constant film.

In accordance with the present invention, we have recognized that allowing substrate bombardment during HDP deposition of a carbon-doped silicon oxide film results in the filling of the intra-metal gaps with low k material having high carbon content. The process leads to the placement of a low k material exactly in the area where it can do the most good. Since the sputter process can only effectively bombard the film on the horizontal surface, the film deposited in the gaps between metal lines is least affected by the bombardment energy and, thus, maintains a carbon content conducive to low k properties. The film deposited over the metal lines has a higher dielectric constant due to the removal of carbon from these upper films during ion bombardment. Thus, the process effectively delivers material in the gap between narrow metal lines that is filled with low k SiOC dielectric which lowers the capacitance between the metal lines. The films over the metal lines have properties similar to $SiO_2$ and are available for sequential integration processes.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1A:
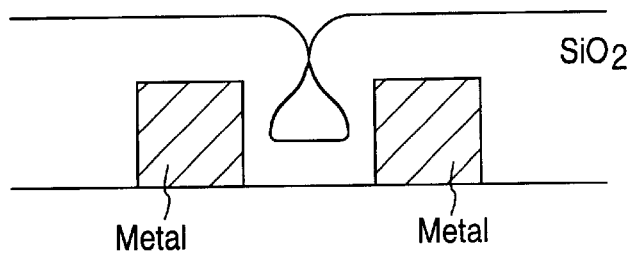
FIG. 1A is a cross-section illustrating formation of a silicon dioxide layer between narrow metal lines utilizing chemical vapor deposition without a sputtering component.
Figure 1B:
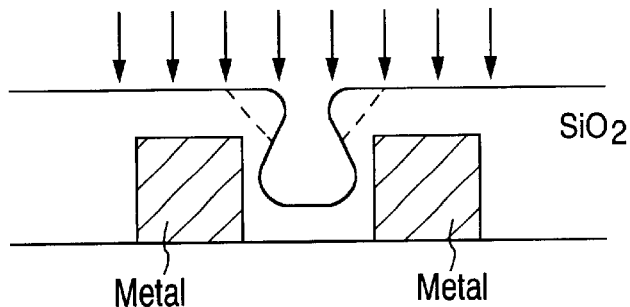
FIG. 1B is a cross-section illustrating formation of a silicon dioxide layer between narrow metal lines utilizing chemical vapor deposition with a sputtering component.
Figure 1C:
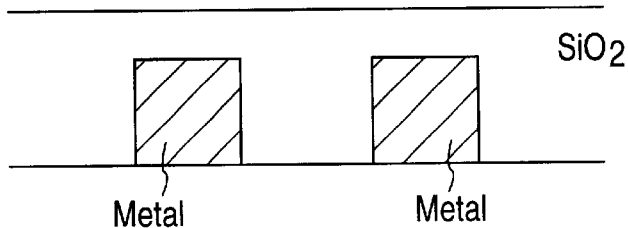
FIG. 1C is a cross-section illustrating a pure silicon dioxide layer formed between narrow metal lines using chemical vapor deposition with a sputtering component.
Figure 2A:
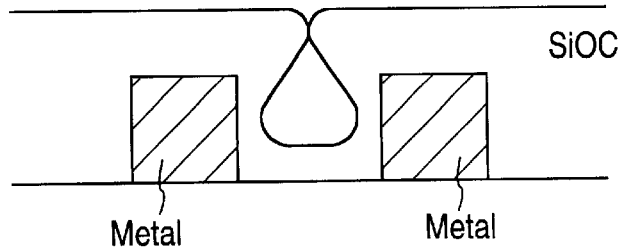
FIG. 2A is a cross-section illustrating formation of a carbon-doped silicon oxide film using chemical vapor deposition without a sputtering component.
Figure 2B:
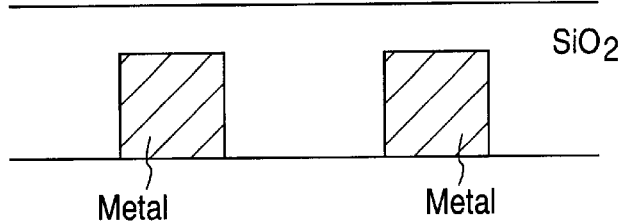
FIG. 2B is a cross-section illustrating attempts to form a carbon-doped silicon oxide film using chemical vapor deposition with a sputtering component but resulting in formation of silicon dioxide.
Figure 3:
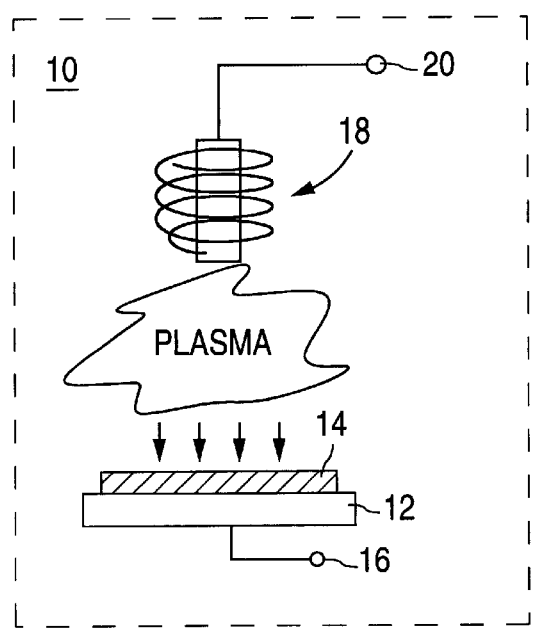
FIG. 3 is a simple pictorial representation of a conventional High Density Plasma Chemical Vapor deposition reactor chamber.

FIG. 3 shows a conventional High Density Plasma Chemical Vapor Deposition (HDP-CVD) reactor chamber 10 in simplified form. The chamber 10 includes a lower support member 12 which can be utilized for supporting a semiconductor wafer 14 for processing in the reactor chamber 10. As shown in FIG. 3, the lower support member 12 can be connected to a source 16 of high frequency bias substrate power which causes sputtering, i.e. bombardment of the horizontal wafer surfaces with ion species generated during the plasma discharge. The reactor chamber 10 also includes an upper electrode 18 to which a power supply 20 is connected for generating a plasma discharge in the conventional manner.

Figure 4A:
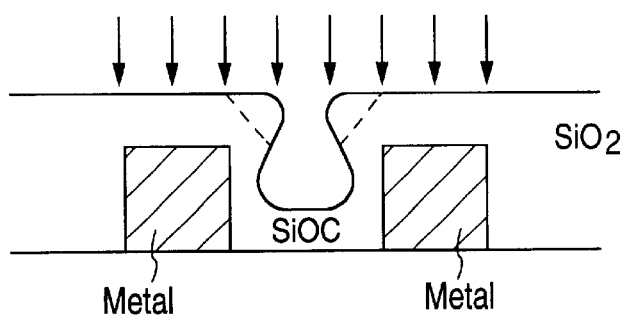
FIG. 4A is a cross-section view illustrating a method for forming a low k dielectric material between narrow metal lines in accordance with the present invention.

Thus, in accordance with the present invention, carbon containing precursors, such as methylsilane or phenylsilane, are utilized to replace silane or added to silane in oxygen (or $H_2O_2$) as the reactant species in the HDP-CVD reactor to produce a low dielectric constant (k) film between narrow metal lines. As shown in FIG. 4A, an HDP-CVD process in accordance with the present invention includes a simultaneous sputter etch, using, for example, Ar or He in the gas mixture, and chemical vapor deposition (CVD) which results in complete filling of the small gaps between the metal lines. The sputter etch component is controlled by high frequency bias power to the substrate in the conventional manner.

Figure 4B:
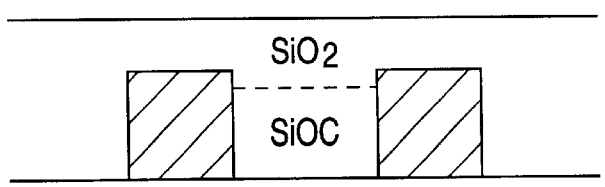
FIG. 4B is a cross-section view illustrating formation of carbon-doped silicon oxide between narrow metal lines with an overlying layer of silicon oxide-like material in accordance with the present invention.

As stated above, an HDP process without bombardment effectively maintains the carbon content in the film and makes a relatively low density film to achieve the lower dielectric constant, but results in voids between the metal lines. A process in accordance with the invention provides for substrate bombardment during HDP deposition, thus filling the intra-metal gaps with low k materials having high carbon contents. This leads to the placement of a low k material in the areas between the metal films where it will do the most good. Since the sputter etch process can only effectively bombard the films on the horizontal surface, the films in the gaps between the metal lines are least affected by the bombardment energy and, thus, maintain a carbon content conducive to low k properties. Films over the metal lines have higher dielectric constant due to the removal of carbon from it during ion bombardment. Thus, the disclosed process delivers a gap effectively filled with low k (k=3.0–3.5) SiOC materials which lower the capacitance between the narrow metal lines. The films over the metal lines have similar properties as silicon dioxide (k=3.5–4.0) and are ready for sequential integration processes. A structure resulting from the above described process is shown in FIG. 4B.

It should be understood that various alternatives to the embodiments of the invention described herein may be employed in practicing the invention. It is intended that the following claims define the scope of the invention and that methods within the scope of these claims and their equivalents be covered thereby.

What is claimed is:

1. A method of forming a low k dielectric film on a layer of material in a chemical vapor deposition (CVD) reactor chamber, the layer of material having first and second structures formed thereon, the method comprising:

introducing a gas mixture including a carbon-containing $SiO_2$ precursor gas, an oxygen-containing gas and a sputtering gas into the CVD reactor chamber;

biasing the reactor chamber to cause chemical vapor deposition and simultaneous sputtering etching such that carbon-containing silicon oxide (SiOC) is deposited on the layer of material between the first and second structures and silicon-oxide-like material is deposited over the first and second structures and over the SiOC.

2. A method as in claim 1, and wherein the carbon-containing $SiO_2$ precursor gas is selected from methylsilane and phenylsilane.

3. A method as in claim 1, and wherein the carbon-containing $SiO_2$ precursor gas comprises methylsilane.

4. A method as in claim 1, and wherein the oxygen-containing gas is selected from $O_2$ and $H_2O_2$.

5. A method as in claim 1, and wherein the sputtering gas is selected from Ar and He.

6. A method as in claim 1, and wherein the first and second structures comprise conductive material.

7. A method as in claim 6, and wherein the conductive material comprises aluminum.

8. A method as in claim 6, and wherein the conductive material comprises copper.

9. A method as in claim 1, and wherein the precursor gas, the oxygen-containing gas and the sputtering gas are the same gas.

10. A method as in claim 1, and wherein the precursor gas, the oxygen-containing gas and the sputtering gas comprise two or more gases that contain these species.

* * * * *